United States Patent [19]

Brokaw

[11] 4,270,118
[45] May 26, 1981

[54] PARALLEL ANALOG-TO-DIGITAL CONVERTER

[75] Inventor: Adrian P. Brokaw, Burlington, Mass.

[73] Assignee: Analog Devices, Incorporated, Norwood, Mass.

[21] Appl. No.: 5,526

[22] Filed: Jan. 22, 1979

Related U.S. Application Data

[63] Continuation of Ser. No. 867,102, Jan. 5, 1978, abandoned.

[51] Int. Cl.³ .......................................... H03K 13/17
[52] U.S. Cl. .............................. 340/347 AD; 307/361
[58] Field of Search ................ 340/347 AD; 307/216, 307/360, 361, 350, 355

[56] References Cited

U.S. PATENT DOCUMENTS

| | | | |
|---|---|---|---|
| 2,894,214 | 7/1959 | Touraton | 340/347 |
| 2,922,151 | 1/1960 | Reiling | 340/347 |
| 3,310,688 | 3/1967 | Ditkofsky | 307/355 |
| 3,510,681 | 5/1970 | Cooperman | 307/216 |
| 3,573,798 | 4/1971 | Reiling | 340/347 |
| 3,662,380 | 5/1972 | Cargile | 340/347 |
| 3,780,317 | 12/1973 | Kurata et al. | 307/355 |
| 4,032,797 | 6/1977 | Metcalf et al. | 307/361 |

FOREIGN PATENT DOCUMENTS 1386256 3/1975 United Kingdom .
1439073 6/1976 United Kingdom .
1508486 4/1978 United Kingdom .

OTHER PUBLICATIONS

IBM Technical Disclosure Bulletin–Self Decoding Comparator Circuit By G. R. Woodman, Jr., vol. 9, No. 12, May 1967, pp. 1797–1798.

Primary Examiner—Felix D. Gruber
Assistant Examiner—Gary Chin
Attorney, Agent, or Firm—Parmelee, Johnson, Bollinger & Bramblett

[57] ABSTRACT

An analog signal is converted into an n bit digital signal by n comparator circuits which compare the analog input to $2^n-1$ reference inputs. Each comparator output alternates as the analog signal increases through the reference levels. Logic circuitry including n-1 exclusive-OR gates decodes the comparator outputs into an n bit code.

A comparator circuit for comparing the analog input signal with each of several reference levels and providing an alternating output includes a pair of differential input transistors and a current sink transistor associated with each reference level. The collectors of the differential transistor pairs are cross coupled to two output resistors which are connected to a differential exclusive-OR gate. A latching circuit is operable to latch the comparator output when the comparator is in other than the comparing mode.

18 Claims, 2 Drawing Figures

PARALLEL ANALOG-TO-DIGITAL CONVERTER

This is a continuation of application Ser. No. 867,102, filed Jan. 5, 1978, now abandoned.

BACKGROUND OF THE INVENTION

This invention relates to analog-to-digital converters and to a comparator circuit useful in a simplified parallel analog-to-digital converter.

A conventional parallel analog-to-digital (A/D) converter compares an analog input signal to each input from a set of discrete voltage levels which define voltage intervals. The converter produces a digital output indicative of the voltage interval into which the analog input signal falls. A separate voltage comparator is associated with each reference level to compare the analog input to that level. Hence, for an n bit digital code which can indicate any of $2^n$ voltage intervals defined by $2^n-1$ quantum levels, $2^n-1$ comparators are required. The reference inputs to the comparators are generally taken from a string of $2^n$ resistors of equal resistance values arranged in series across a reference voltage. The outputs of the $2^n-1$ comparators drive a logic tree to decode the comparator outputs into n bits. Using the conventional circuits, a three bit converter requires seven comparators and a seven-input logic network; and a four bit converter requires fifteen comparators and a fifteen-input logic network.

An object of this invention is to provide an improved A/D converter.

A more specific object of this invention is to provide an A/D converter of the parallel type, and which uses only a relatively small number of comparators to produce an output code.

SUMMARY

According to the invention in one of its aspects, in a parallel A/D converter for converting an analog input signal to an n bit digital code, the analog input is compared to $2^n-1$ discrete reference levels in n comparators. Each comparator has a one bit binary output, the value of which alternates as the analog input signal increases through the discrete reference signal levels. Logic circuitry produces the n bit code from the n comparator outputs.

According to other aspects of the invention, the logic circuitry includes $n-1$ exclusive-OR gates.

According to yet other aspects of the invention, the comparator comprises a pair of differential transistors associated with each reference level. The collectors of the transistor pairs are cross coupled to draw current through two load resistors, the relative current through which indicates a one bit binary output.

According to other aspects of the invention, the comparator output resistors are connected to a differential exclusive-OR gate and the comparator includes a latch circuit.

BRIEF DESCRIPTION OF THE DRAWINGS

The foregoing and other objects, features, and advantages of the invention will be apparent from the following more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

BRIEF DESCRIPTION OF A PREFERRED EMBODIMENT

Figure 1:
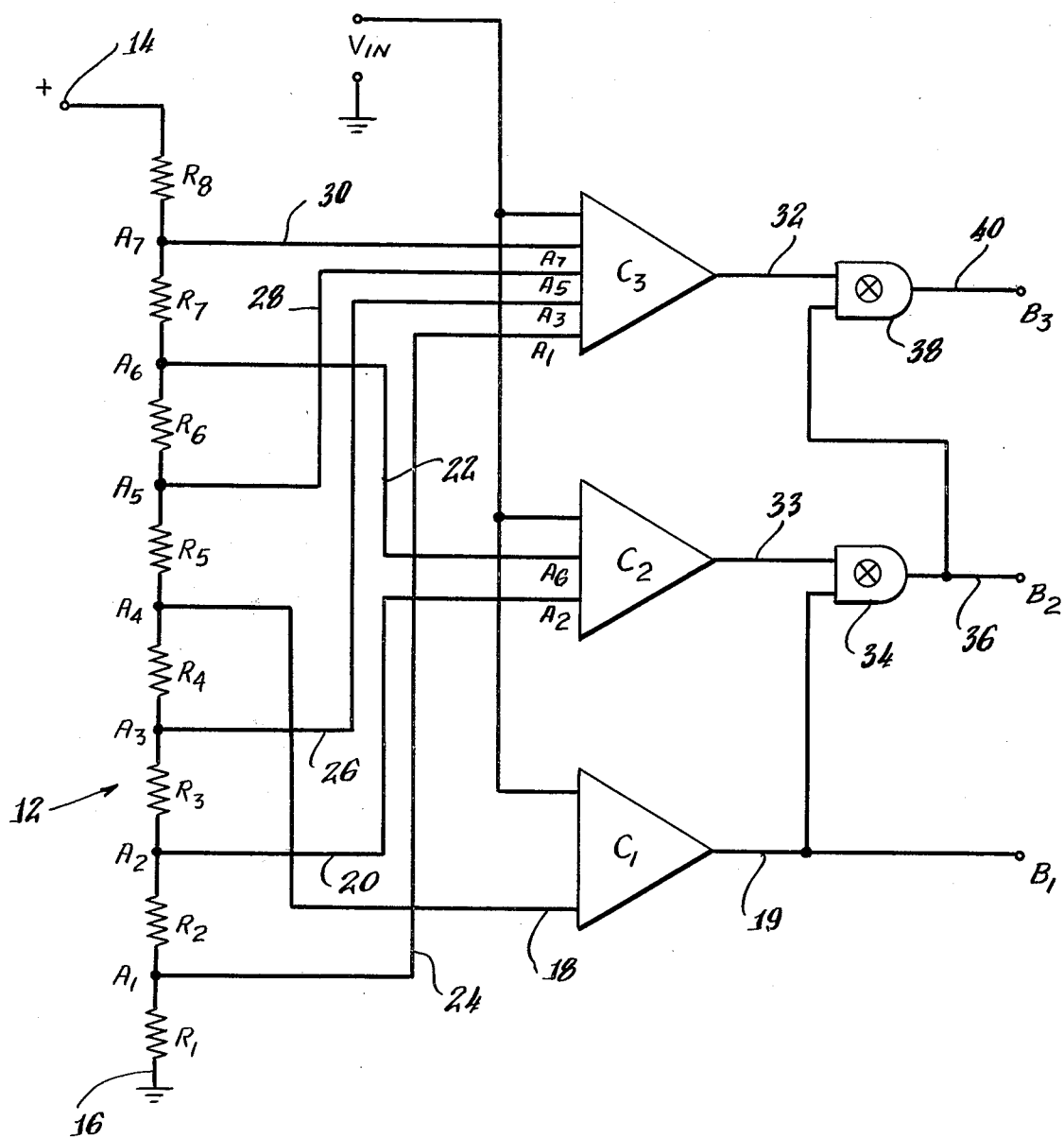
FIG. 1 is a schematic of an A/D converter including three comparators for providing a three bit code.

The A/D converter of FIG. 1 converts the analog input signal $V_{IN}$ into a three bit digital code including bits $B_1$, $B_2$, and $B_3$. Seven reference levels $A_1$, $A_2$, $A_3$, $A_4$, $A_5$, $A_6$, and $A_7$ are provided by reference means 12 which includes eight resistors $R_1$ through $R_8$ connected in series across a positive reference voltage 14 and a ground connection 16. Reference levels $A_1$ through $A_7$ are taken from the nodal points between respective resistors. The analog input signal $V_{IN}$ is compared to the seven reference levels in three comparators, $C_1$, $C_2$ and $C_3$.

Reference $A_4$ is applied to the comparator $C_1$ through line 18. Comparator $C_1$ is a conventional two input comparator and provides a high output on line 19 when the analog input signal is greater than the reference level $A_4$ on line 18.

In the comparator $C_2$ the analog input signal is compared to reference levels $A_2$ and $A_6$ applied through respective lines 20 and 22. The output of comparator $C_2$ on line 33 is a one bit signal, the value of which alternates as the analog input signal increases past the reference levels $A_2$ and $A_6$. When the analog input is less than reference level $A_2$, the output on line 23 is low. When the input increases to a level greater than $A_2$ but less than $A_6$ the output on line 23 is high. And when the input increases past level $A_6$ the output on line 23 returns low.

The analog input signal is compared to reference levels $A_1$, $A_3$, $A_5$ and $A_7$ in comparator $C_3$. The respective reference levels are applied to the comparator through lines 24, 26, 28 and 30. The one bit output on line 32 alternates as the analog input signal increases through each of these reference levels. Hence, with the analog input less than level $A_1$ the output on line 32 is low. This output switches high as the analog input increases to a voltage level between the reference levels $A_1$ and $A_3$. With the analog input between levels $A_3$ and $A_5$ the comparator output returns to a low condition. Similarly, with the analog input between reference levels $A_5$ and $A_7$ the one bit output on line 32 is high. And the output returns low as the analog input increases past reference level $A_7$.

The bit output $B_1$ of the parallel A/D converter is taken directly from the output 19 of comparator $C_1$. This output 19 is also input to an exclusive-OR gate 34 along with the output 23 from comparator $C_2$. The output 36 from the exclusive-OR gate 34 provides the second output bit $B_2$ from the converter and is also applied to a second exclusive-OR gate 38. The output 32 from comparator $C_3$ is also applied to the gate 38 to provide the third bit output $B_3$ of the converter on line 40.

Bit $B_1$ on line 19 is the most significant bit of the digital code and should be low for the lower four intervals of the analog input signal and high for the higher intervals. This result is obtained by connecting the mid-level reference $A_4$ to the comparator $C_1$. For all values of $V_{IN}$ less than the level $A_4$ bit $B_1$ is low and for all values greater than that level $B_1$ is high.

In the conventional binary code, the second bit $B_2$ should indicate whether the analog input $V_{IN}$ is in the lower or upper portion of the reference interval determined by bit $B_1$. Hence, the reference levels applied as inputs to comparator $C_2$ are the mid-levels within either of the two reference ranges indicated by bit $B_1$, that is, levels $A_2$ and $A_6$. With the analog input signal less than the voltage at $A_2$, the $C_1$ comparator output, bit $B_1$, is low; the output from comparator $C_2$ is also low and thus the output on line 36, bit $B_2$, is low. If the analog input increases to a level above level $A_2$ the output from comparator $C_2$ on line 23 goes high while the output from comparator $C_1$ remains low, and the exclusive-OR output on line 36 goes high to give a bit $B_2$ value of "1". As the analog input signal increases past level $A_4$ the signal on line 23 remains high but comparator $C_1$ switches to also give a high output on line 19. The result is a low output on line 36 giving a bit $B_2$ value of "0". As the analog signal further increases past level $A_6$ the signal on line 19 remains high but comparator $C_2$ switches to give a low output on line 23. The result is a high output on line 36 or a bit $B_2$ value of "1".

Bit $B_3$ is the least significant bit and should indicate whether the analog input is in the upper or lower portion of each interval covered by each combination of the bits $B_1$ and $B_2$. Hence, the inputs to comparator $C_3$ are taken from the mid-levels of each voltage interval defined by bits $B_1$ and $B_2$. In the same manner that the output of exclusive-OR gate 34 alternates as the analog signal passes through levels $A_2$, $A_4$ and $A_6$, the output on line 40 from the exlusive-OR gate 38 alternates as the analog signal passes through each reference level $A_1$ through $A_7$.

A summary of the comparator outputs and the bit values for an analog input signal within each reference interval is set forth in the following table:

| $V_{IN}$ | $C_1$ | $B_1$ | $C_2$ | $B_2$ | $C_3$ | $B_3$ | Code ($B_1 B_2 B_3$) |
|---|---|---|---|---|---|---|---|
| $V_{IN} < A_1$ | 0 | 0 | 0 | 0 | 0 | 0 | 000 |
| $A_1 < V_{IN} < A_2$ | 0 | 0 | 0 | 0 | 1 | 1 | 001 |
| $A_2 < V_{IN} < A_3$ | 0 | 0 | 1 | 1 | 1 | 0 | 010 |
| $A_3 < V_{IN} < A_4$ | 0 | 0 | 1 | 1 | 0 | 1 | 011 |
| $A_4 < V_{IN} < A_5$ | 1 | 1 | 1 | 0 | 0 | 0 | 100 |
| $A_5 < V_{IN} < A_6$ | 1 | 1 | 1 | 0 | 1 | 1 | 101 |
| $A_6 < V_{IN} < A_7$ | 1 | 1 | 0 | 1 | 1 | 0 | 110 |
| $A_7 < V_{IN}$ | 1 | 1 | 0 | 1 | 0 | 1 | 111 |

The A/D converter of FIG. 1 provides a three bit digital output. However, it should be readily understood that that converter can be reduced or expanded to provide a code having more or less bits. For example, to provide a four bit code, each resistor $R_1$ through $R_8$ could be center-tapped and each of the eight reference levels so provided would then be applied to a fourth comparator, the output of which alternates as the analog input signal $V_{IN}$ passes through those eight reference levels. The output from that fourth comparator would be applied along with the $B_3$ output to a third exclusive-OR gate to provide bit $B_4$.

In more general terms, a parallel analog-to-digital converter can be designed according to this invention to convert an analog input signal to an n bit digital code including bits $B_1, B_2, \ldots B_j, \ldots B_n$. The reference means 12 establishes $2^n - 1$ discrete reference signal levels $A_1$, $A_2, \ldots A_k, \ldots A_{2n-1}$. Each comparator $C_1, C_2, \ldots C_j$, $\ldots C_n$ compares the analog input signal to all signal levels $A_k$ in the set $\pm A_{2n(m/2j)} \mp$ wherein m is any of the first $2^{j-1}$ odd intergers. Logic means set the value of each bit $B_j$ in accordance with the output of comparators $C_1$ through $C_j$. More particularly, the logic means comprises $n - 1$ exclusive-OR gates, each gate having as one input thereto the output of a comparator $C_j$ other than $C_1$ and the output $B_{j-1}$.

Figure 2:
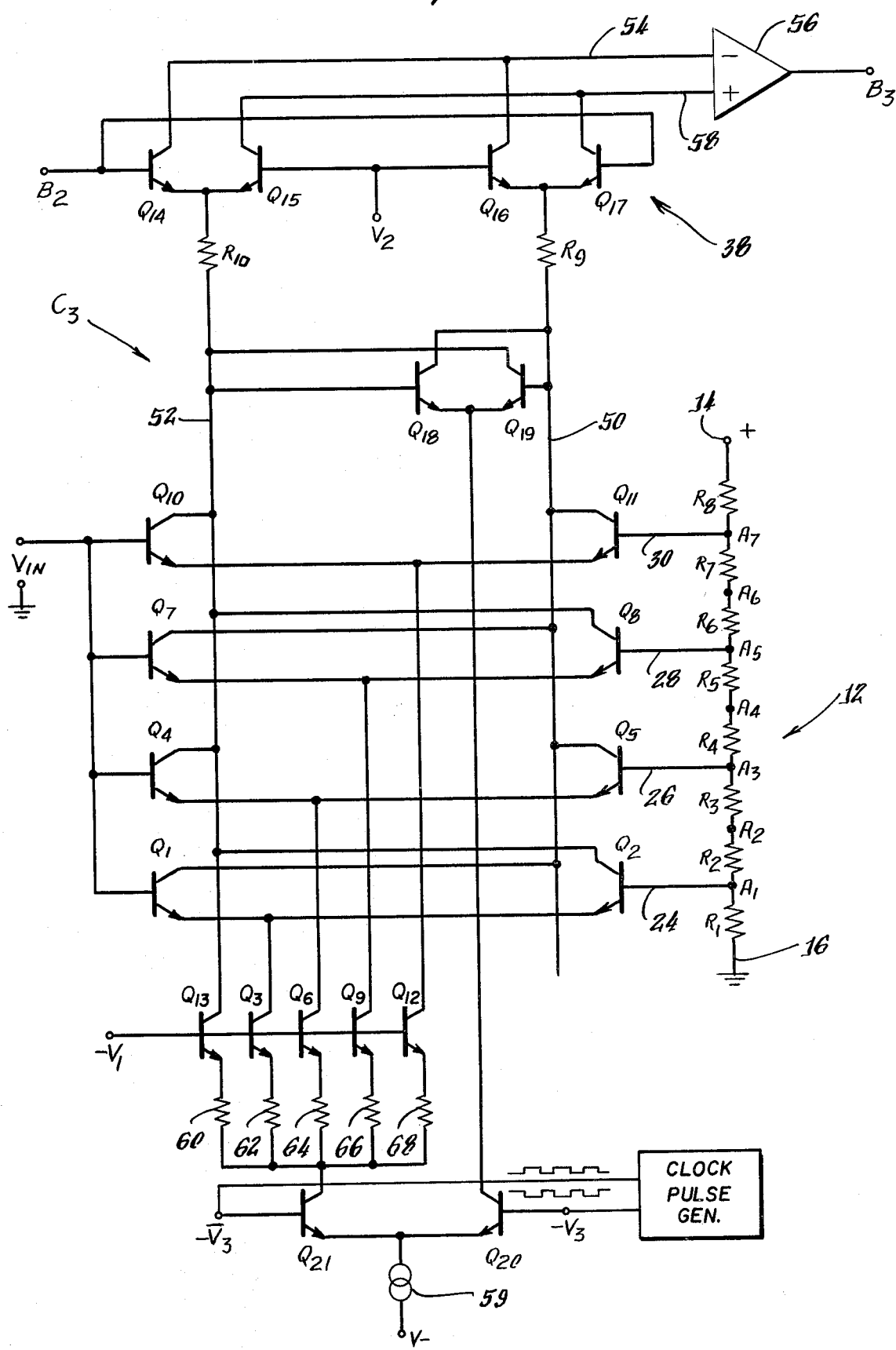
FIG. 2 is a detailed schematic of the circuitry in the comparator $C_3$ of FIG. 1 and its associated exclusive-OR gate.

The simplified A/D converter of FIG. 1 is made possible by the use of comparator circuits $C_2$ and $C_3$ each of which has a plurality of reference inputs and a one bit output which alternates from low to high as the analog input passes through those reference inputs. A more detailed schematic of the comparator $C_3$ and its associated exclusive-OR gate 38 is shown in FIG. 2.

The comparator $C_3$ includes a pair of differential transistors associated with each reference level $A_1$, $A_3$, $A_5$ and $A_7$. Associated with reference level $A_1$ is a pair of differentially connected transistors including an input transistor $Q_1$ and a reference transistor $Q_2$. The analog input signal is applied to input transistor $Q_1$ and the reference level signal $A_1$ is applied to the base of transistor $Q_2$. The transistor emitters are connected in common to the collector of current sink transistor $Q_3$. Transistor $Q_3$ is base biased by a constant voltage $V_1$ and thus acts as a current sink in the usual manner. The collector of transistor $Q_1$ is connected to a connector 50 and the collector of transistor $Q_2$ is connected to a connector 52.

Similarly, a pair of transistors including an input transistor $Q_4$ and a reference transistor $Q_5$ is associated with the reference level $A_3$. The emitters of transistors $Q_4$ and $Q_5$ are connected to transistor $Q_6$ which is base biased by voltage $V_1$ to serve as a current sink. The collectors of transistors $Q_4$ and $Q_5$ are cross coupled with respect to those of transistors $Q_1$ and $Q_2$. That is, the collector of input transistor $Q_4$ is connected to common connector 52 and the collector of reference transistor $Q_5$ is connected to common connector 50.

A third pair of differential transistors including input transistor $Q_7$ and reference transistor $Q_8$ are associated with the reference level $A_5$. The collectors of these transistors are cross coupled to lines 50 and 52 with respect to the transistor pair associated with level $A_3$ but are parallel coupled with respect to the pair associated with level $A_1$.

Differential transistor pair $Q_{10}$ and $Q_{11}$, associated with reference level $A_7$, has a current sink transistor $Q_{12}$ base biased by voltage $V_1$. This pair of transistors is collector cross coupled with respect to the $A_1$ and $A_5$ reference pairs but is parallel coupled with respect to the $A_3$ reference pair.

It can be seen that the $A_1$ reference pair and the $A_5$ reference pair make up a first set of transistor pairs associated with a first set of non-successive reference inputs, the transistors in the first set of transistor pairs being similarly collector coupled by common connectors 50 and 52. The $A_3$ reference pair and the $A_7$ reference pair make up a second set of transistor pairs associated with a second set of non-successive reference inputs. The transistors within this second set of transistor pairs are similarly coupled to common connector lines 50 and 52 but are cross coupled with respect to those transistors in the first set. Further, the common connector means 52 connects the outputs of the reference transistors of the first set of transistor pairs in common with each other and with the outputs of input transistors of the second set of transistor pairs. And the second common connector 50 connects the outputs of the reference transistors of the second set of transistors in common with each other and with the outputs of input transistors of the first set of transistor pairs.

The current drawn through the four differential pairs is drawn through resistors $R_9$ and $R_{10}$, respectively connected to common connectors 50 and 52 in series with the parallel transistor pairs. The basic comparator circuit further includes an additional current sink transistor $Q_{13}$ common base connected with the other current sink transistors and base biased by constant voltage $V_1$.

Assuming a proper bias to resistors $R_9$ and $R_{10}$ and a closed circuit to a negative supply from the current sink emitters, the operation of the basic comparator circuit can be set forth. With a constant current drawn through each transistor pair, the portion of the constant current drawn through respective collectors of each transistor in each pair is determined by the level of the analog input signal $V_{IN}$ relative to the reference input associated with that pair. For transistor pairs in the first set, when the input voltage is less than the reference level associated with a transistor pair, the reference transistor of that pair will conduct more than the input transistor, thereby drawing current through line 52 and tending to create a voltage drop across resistor $R_{10}$ greater than the voltage drop across the resistor $R_9$. As the input voltage increases past that reference level, the input transistor will conduct more thus increasing the voltage across resistor $R_9$ relative to the voltage across resistor $R_{10}$. On the other hand, each transistor pair in the second set of transistors draws more current through line 50 and resistor $R_9$ when the analog input is less than the respective reference level and more current through line 52 and resistor $R_{10}$ when the analog input is greater than the respective reference level.

In the following description of the operation of the circuit, it is assumed that each differential transistor pair switches quickly as the analog input passes the associated reference level, that is, that with the analog input less than the reference level substantially all of the current drawn through the pair passes through the input transistor and that with the input above the reference level, substantially all current passes through the reference transistor. It is also assumed that the differences in reference levels is sufficiently great so that when the base voltages applied to the transistors of one pair are equal, that is, where $V_{IN}$ equals a reference level, there is no substantial change in current division in adjacent pairs. Deviations from these assumptions will be accounted for after the description of the basic circuit operation.

With an initial input voltage less than reference level $A_1$, the current drawn through resistors $R_9$ and $R_{10}$ by the four transistor pairs is balanced due to the cross coupled connections of successive transistor pairs. However, current sink transistor $Q_{13}$ draws an offset current through line 52 and thus increases the voltage across resistor $R_{10}$. The value of a one bit comparator output can be defined by the relative voltage drops across resistors $R_9$ and $R_{10}$ which provide means for detecting the amount of current drawn through the first common connector relative to the current drawn through the second common connector. The increased voltage drop across resistor $R_{10}$ due to the current through transistor $Q_{13}$ can be defined as a low or "0" output.

As the analog input voltage $V_{IN}$ increases past reference level $A_1$, a greater portion of the transistor $Q_3$ current is drawn through transistor $Q_1$ relative to transistor $Q_2$. Thus there is a shift in current from common connector 52 and resistor $R_{10}$ to common connector 50 and resistor $R_9$. With the analog input greater than the reference level $A_1$, a unit of current is shifted from resistor $R_{10}$ to resistor $R_9$ by the first transistor pair. Current is thus drawn through resistor $R_9$ by transistors $Q_1$, $Q_5$, and $Q_{11}$ and current is drawn through resistor $R_{10}$ by transistor $Q_8$ and offset transistor $Q_{13}$. The shift of current results in greater current through resistor $R_9$ than through resistor $R_{10}$, and this condition can be defined as a high or "1" comparator output.

As the analog input signal further increases past the $A_3$ level, a greater portion of current is drawn through transistor $Q_4$ relative to transistor $Q_5$ in the second transistor pair. The current drawn through this pair shifts from resistor $R_9$ to resistor $R_{10}$. Current is thus drawn through resistor $R_9$ by transistors $Q_1$ and $Q_{11}$ and current is drawn through resistor $R_{10}$ by transistors $Q_8$ and $Q_{13}$. With three transistors drawing current through resistor $R_{10}$ and only two transistors drawing through resistor $R_9$, the voltage drop across resistor $R_{10}$ is greater than that across resistor $R_9$ and there is a low output.

As the analog input signal continues to increase past reference level $A_5$, the third transistor pair including transistors $Q_7$ and $Q_8$ shifts and the voltage drop across resistor $R_9$ becomes greater than that across resistor $R_{10}$ rendering a high condition. Finally, as the analog input signal passes reference level $A_7$, the fourth pair of differential transistors shifts. This renders a low comparator output with greater current through resistor $R_{10}$ than through resistor $R_9$.

Thus the output of the above described basic comparator circuit $C_3$ alternates between low and high outputs as the analog input signal $V_{IN}$ increases from zero level through the four reference levels. The comparator $C_2$ is of similar circuit design but with only two differential transistor pairs. For a four bit code the fourth comparator would include eight differential transistor pairs associated with eight reference inputs and so on.

The comparator output, which includes the current drawn through resistors $R_9$ and $R_{10}$, is connected to a differential exclusive-OR logic gate circuit 38 shown in detail in FIG. 2. The current through the resistor $R_{10}$ is drawn through a gate differential transistor pair including transistors $Q_{14}$ and $Q_{15}$. The current through the resistor $R_9$ is drawn through a gate differential transistor pair including transistors $Q_{16}$ and $Q_{17}$. A reference voltage $V_2$ is applied to the bases of transistors $Q_{15}$ and $Q_{16}$ and the output of the exclusive-OR gate 34 (FIG. 1), bit $B_2$, is applied to the bases of the transistors $Q_{14}$ and $Q_{17}$. The collectors of transistors $Q_{14}$ and $Q_{16}$ are connected to an input 54 of an output buffer 56. The collectors of transistors $Q_{15}$ and $Q_{17}$ are connected to a second input 58 to the output buffer 56.

With greater current through resistor $R_{10}$ than through resistor $R_9$, indicative of a low comparator output, more current is drawn through the transistor pair $Q_{14}$, $Q_{15}$ than through the pair of $Q_{16}$, $Q_{17}$; hence, the pair $Q_{14}$, $Q_{15}$ has a greater effect on the relative current signals on lines 54 and 58. With a low bit $B_2$ input applied to the bases of transistors $Q_{14}$ and $Q_{17}$, transistors $Q_{15}$ and $Q_{16}$ conduct due to the $V_2$ bias. Because more current is drawn by the comparator $C_3$ through transistor $Q_{15}$ than through transistor $Q_{16}$ the current signal on line 58 is greater than that on line 54 and buffer 56 has a low output. This low output value of bit $B_3$ is in accordance with the table where there is a low bit $B_2$ and a low output from comparator $C_3$. If bit $B_2$ were to go high, the signal would be shifted from the line 58 to line 54 due to the increased conductance of transistor $Q_{14}$ relative to transistor $Q_{15}$. Thus buffer 56 would have a high $B_3$ output which is again in accordance with the table.

With greater current flow through resistor $R_9$ than through resistor $R_{10}$, the transistor pair $Q_{16}$, $Q_{17}$ has the greater effect on the input to buffer 56. Hence, with a low $B_2$ input, transistor $Q_{16}$ conducts greater current than does transistor $Q_{15}$ and the signal on line 54 is greater than that on line 58. The buffer 56 provides a high $B_3$ output. This is the proper output indicated by the table for a low $B_2$ value and a high output from comparator $C_3$. Finally, with a high $B_2$ value, transistor $Q_{17}$ conducts more than does transistor $Q_{14}$ and the signal on line 58 is greater than that on line 54 resulting in a low $B_3$ output.

Thus the above circuitry provides the basic elements required for the comparator $C_3$ and exclusive-OR gate 38 in the A/D converter of FIG. 1.

A refinement in the above described comparator circuitry is made by providing a latch circuit including transistors $Q_{18}$ and $Q_{19}$. These transistors are cross coupled as a flip-flop with the base of transistor $Q_{18}$ connected to common connector 52 and the $Q_{18}$ collector connected to common connector 50. The $Q_{19}$ transistor base is connected to common connector 50 and its collector is connected to connector 52. The current bias for the flip-flop circuit is provided by a transistor $Q_{20}$ in a differential circuit. The differential circuit, including transistors $Q_{20}$ and $Q_{21}$, is in turn current biased by a current source 59 connected to a negative supply. Transistor $Q_{21}$ provides the total current drawn through the current sink transistors $Q_3$, $Q_6$, $Q_9$, $Q_{12}$ and $Q_{13}$. Each of these current sink transistors is connected to transistor $Q_{21}$ through respective emitter resistors 60, 62, 64, 66 and 68 of equal resistances. Due to the equal emitter resistances and the common base bias, the current flowing through transistor $Q_{21}$ is divided equally among the five current sink transistors.

The respective transistors $Q_{20}$ and $Q_{21}$ are base biased by negative clock signals $V_3$ and $\overline{V_3}$. With a high $V_3$ signal and thus a low $\overline{V_3}$ signal the current through current source 58 is drawn through transistor $Q_{20}$ to provide bias current in a latching mode to the flip-flop circuit of transistors $Q_{18}$ and $Q_{19}$. However, with a low $V_3$ input, and thus a high $\overline{V_3}$ input, the current flows through the comparator circuit and not the latching circuit in a comparison mode.

The latching circuit accounts for the lack of immediate switching of current from the reference transistors to the input transistors as the analog input increases past the reference levels. If for example the analog input signal is only slightly less than reference level $A_1$, the transistors $Q_1$ and $Q_2$ are in a nearly balanced condition in the comparison mode. Transistor $Q_2$ does have a slightly greater amount of current flowing therethrough and thus there is a voltage drop across resistor $R_{10}$ slightly greater than that across resistor $R_9$. But this slight difference would not be recognized by the exclusive-OR gate. However, when control signal $V_3$ then goes high, the voltage on line 50 at the base of transistor $Q_{19}$ is slightly greater than the voltage on line 52 at the base of the transistor $Q_{18}$. A slightly greater portion of the current flowing through transistor $Q_{20}$ will thus pass through transistor $Q_{19}$ and a greater amount of current will be drawn by the latching circuit through the collector of transistor $Q_{19}$ and resistor $R_{10}$ than through the collector of transistor $Q_{18}$ and the resistor $R_9$. This further increases the voltage across resistor $R_{10}$ and thus decreases the base bias of transistor $Q_{18}$. In this regenerative fashion transistor $Q_{18}$ is driven to a substantially off condition whereas transistor $Q_{19}$ is driven to a completely on condition such that the current drawn by the current source 58 through transistor $Q_{20}$ flows primarily through transistor $Q_{19}$ and resistor $R_{10}$, a condition which can be recognized by the exclusive-OR gate.

Once the analog input signal has increased to a level slightly above reference level $A_1$, slightly more current passes through transistor $Q_1$ than through transistor $Q_2$ when the circuit is in the comparison mode and, when the circuit is switched to the latching mode, the resulting slight difference in base voltage is sensed as a slightly higher base bias to transistor $Q_{18}$. Transistor $Q_{18}$ thus draws more current through resistor $R_9$, thereby reducing the base bias to transistor $Q_{19}$ and providing a well defined high comparator output. Hence, these two transistors regeneratively reinforce the initial conditions established by even a small current unbalance near one of the comparator critical reference points.

In the initial analysis of the operation of the basic comparator circuit, it was assumed that the reference levels were far enough apart to equalize the base voltages of the transistors in a differential pair without substantial current flow through the input transistor of the differential transistor pair associated with the next higher reference level. If this assumption were not valid, a shift in the critical points where the comparator shifts from a low to a high and a high to a low condition would be noted with respect to the lowest and highest reference levels. This would be due to the fact that, for example, the shift in the comparator output at the reference $A_1$ level would be due not only to the transfer of current flow from transistor $Q_2$ to transistor $Q_1$ but also, to a lesser extent, to the transfer of current from transistor $Q_5$ to transistor $Q_4$. There would be no shift in the critical point at reference levels $A_3$ and $A_5$ because any interference from the next higher differential transistor pair would be offset by the next lower pair. Hence, a possible remedy for the critical point shift in the lower and upper critical points would be provide buffer differential transistor pairs below and above those shown.

A main advantage of the A/D converter of FIG. 1 including the circuitry of FIG. 2 is that only three comparator outputs are required for a three bit code, and similarly, only four comparator outputs are required for a four bit code. This leads to extremely simple decoding as has been illustrated with the two exclusive-OR gates in the three bit code. Beyond the above is the advantage that in an integrated circuit, a conservation of isolated collector regions is possible with this A/D converter. In the conventional parallel A/D converter a separate isolated collector pocket is required for each collector of each transistor in each of the $2^n - 1$ comparators. Hence, for a four bit code which requires fifteen comparators, thirty separate collector pockets are required. However, in the present converter only two collector pockets are required for each comparator. For example, for the circuit in FIG. 2 one collector pocket would be associated with common connector 50 and another with common connector 52. With four comparators in a four bit converter only eight collector pockets would be required as compared to the thirty required by the conventional approach.

A further simplification in the integrated circuitry is possible with the multiple input comparators since the bases of the input transistors in a comparator are in common. Hence, the transistors $Q_1$ and $Q_7$ in FIG. 2 could be made by forming two emitter regions in a single base region in one of the collector pockets. And transistors $Q_4$ and $Q_{10}$ could be made by forming two emitter regions in a single base region in the second collector pocket. The greater the number of differential transistor pairs required in a comparator the greater would be the savings in the base regions.

The A/D converter described with reference to FIGS. 1 and 2 offers great advantages in circuit simplification and simplification of the integration of the circuit in a multibit parallel A/D converter. A three or four bit parallel converter embodying this invention may also be used as the basis for a multibit successive approximation converter which converts three or four bits at a time.

While the invention has been particularly shown and described with reference to a preferred embodiment thereof, it will be understood by those skilled in the art that various changes in form and details may be made therein without departing from the spirit and scope of the invention as defined by the appended claims.

I claim:

1. An A-to-D converter comprising an electronic comparator for comparing an analog input signal with each of a number of discrete level reference signal inputs, said comparator having a one bit binary output, the value of which alternates as the analog signal increases to successively exceed said reference signal levels, said comparator comprising:
    a pair of differential transistors associated with each reference input, the base of a reference transistor of each pair being connected to the associated reference input and the base of an input transistor of each pair being connected to the analog input signal;
    first common connector means for connecting the outputs of the reference transistors of a first set of transistor pairs associated with a first set of non-successive reference inputs in common with each other and with the outputs of the input transistors of a second set of transistor pairs associated with a second set of non-successive reference inputs;
    second common connector means for connecting the outputs of the reference transistors of said second set of transistor pairs in common with each other and with the outputs of the input transistors of said first set of transistor pairs;
    differential transistor bias means for drawing predetermined amounts of current through each of said pairs of differential transistors, the portions of said predetermined amounts of current drawn through each transistor of each pair being determined by the level of said analog input signal relative to said associated reference input; and
    means for detecting the amount of current drawn through said first common connector means relative to the current drawn through said second common connector means,
    whereby the relative currents through said connector means indicates said one bit binary output.

2. The electronic comparator as claimed in claim 1 wherein each pair of differential transistors comprises a pair of common emitter transistors and the collectors of successive pairs of differential transistors are cross coupled to said first and second common connector means.

3. The electronic comparator as claimed in claim 1 further comprising a latching circuit coupled to said first and second common connector means and operable regeneratively to reinforce conditions established in said connector means by a small current unbalance when the analog signal is close to the value of the corresponding reference signal.

4. The electronic comparator as claimed in claim 1 wherein said differential transistor bias means comprises a separate bias transistor associated with each pair of differential transistors, the bases of said bias transistors being connected in common so that equal amounts of current are drawn through said pairs of differential transistors.

5. An A-to-D converter comprising an electronic comparator and exclusive-OR logic gate for comparing an analog input signal with each of a number of discrete level reference signal inputs, said comparator having a one bit binary output the value of which alternates as the analog signal increases to successively exceed said reference signal levels, and for combining said one bit binary output with a second one bit binary signal according to an exclusive-OR function, said comparator and exclusive-OR gate comprising:
    a pair of differential transistors associated with each reference input, the base of a reference transistor of each pair being connected to the associated reference input and the base of an input transistor of each pair being connected to the analog input signal;
    first common connector means for connecting the outputs of the reference transistors of a first set of transistor pairs associated with a first set of non-successive reference inputs in common with each other and with the outputs of the input transistors of a second set of transistor pairs associated with a second set of non-successive reference inputs;
    second common connector means for connecting the outputs of the reference transistors of said second set of transistor pairs in common with each other and with the outputs of the input transistors of said first set of transistor pairs;
    differential transistor bias means for drawing predetermined amounts of current through each of said pairs of differential transistors, the portions of said predetermined amounts of current drawn through each transistor of each pair being determined by the level of said analog input signal relative to said associated reference input;
    a first gate differential transistor pair connected to detect the amount of current drawn through said first common connector means and a second gate differential transistor pair connected to detect the amount of current drawn through said second common connector means;
    means for applying a common bias voltage to one transistor of each of said gate differential transistor pairs;
    means for applying said other one bit binary signal to the bases of the other transistors of said gate differential transistor pairs;
    means for cross coupling the outputs of said gate differential transistor pairs to two gate outputs; and
    means for detecting the relative values of said two gate outputs.

6. The electronic comparator as claimed in claim 5 wherein each pair of differential transistors comprises a pair of common emitter transistors and the collectors of successive pairs of differential transistors are cross coupled to said first and second common connector means.

7. The electronic comparator as claimed in claim 5 further comprising a latching circuit coupled to said first and second common connector means and operable regeneratively to reinforce conditions established in said connector means by a small current unbalance when the analog signal is close to the value of the corresponding reference signal.

8. The electronic comparator as claimed in claim 5 wherein said differential transistor bias means comprises a separate bias transistor associated with each pair of differential transistors, the bases of said bias transistors being connected in common so that equal amounts of current are drawn through said pairs of differential transistors.

9. In a parallel analog-to digital converter of the type having an input circuit to receive an analog input signal, a plurality of comparators connected in common to said circuit with each providing one bit of the digital output signal, and wherein the value of such bit alternates as the input analog signal varies through its range of variation;

that improvement wherein at least one of said comparators comprises:
reference circuit means establishing a plurality of discrete predetermined fixed progressive-valued reference signal levels;
a plurality of voltage comparison circuit means each having an input terminal and a reference terminal;
means connecting all of said input terminals in common to said input circuit to receive the analog signal applied thereto;
means connecting said reference signal levels to respective reference terminals of said plurality of voltage-comparison circuit means;
said plurality of voltage comparison circuit means each including output circuit means electrically isolated from said reference circuit means and operable to produce a comparison signal having a level determined by whether the input terminal or the reference terminal of that voltage-comparison circuit means receives the higher signal level;
said isolation of said reference circuit means providing for maintenance of said predetermined reference signal levels independent of alteration of the value of any of the comparison signals;
offset means coupled to said plurality of voltage comparison circuit means to provide thereto a predetermined bias signal; and
combining means coupled to all of said output circuit means and including means responsive to all or said comparison signals and said bias signal to develop a composite binary output signal having a net value determined by the net values of all of said comparison signals.

10. Apparatus as in claim 9, comprising a plurality of current generators each coupled to a respective voltage comparison circuit means to control the corresponding output current thereof to a predetermined magnitude.

11. Apparatus as in claim 9, wherein said offset means comprises a current generator directing a bias current of a predetermined level to said output circuit means.

12. Apparatus as in claim 9, wherein each of said comparison circuit means comprises first and second output terminals and differential means to produce a differential comparison signal at said first and second output terminals;
said combining means comprising first and second output leads;
means connecting all of said first output terminals in common to said first output lead; and
means connecting all of said second output terminals in common to said second output lead.

13. A converter as claimed in claim 12, wherein said comparison circuits comprise a pair of transistors;
means connecting the emitters of each transistor pair together;
means connecting the collectors of each pair to said first and second output leads respectively;
means connecting the base of one transistor of each pair to said input terminal; and
means connecting the base of the other transistor of each pair to the respective reference signal level.

14. A converter as claimed in claim 13, including current sink means connected to said emitters to control the current level flowing through one or the other collector in accordance with the relative values of the corresponding input and reference signals.

15. A converter as claimed in claim 12, including latching means connected to said first and second output leads and including regenerative means responsive to the relative signal levels on said two leads for locking in the binary value as the input signal applied to any of said comparison circuits is close to equality with the corresponding reference signal level.

16. A converter as claimed in claim 15, wherein said latching means comprises two transistors having their bases connected respectively to said first and second output leads and their collectors cross-coupled respectively to said first and second output leads;
means connecting the emitters of said two transistors together;
current control means coupled to said emitters to provide a predetermined current flow from the emitters; and
clock means coupled to said latching means to time the operation thereof in accordance with clock pulses.

17. A converter as claimed in claim 12, wherein each of said comparison circuits comprises differentially-operable means for alternatively developing a comparison signal for one or the other of said first and second output leads in accordance with whether said input signal or the corresponding reference signal is the higher; and
a balanced exclusive-OR circuit connected to said first and second output leads and responsive to the bit output from another of said comparators to develop the digital bit output for one of said comparators.

18. A converter as claimed in claim 17, wherein said exclusive-OR circuit comprises two pairs of transistors wherein the emitters of each pair are connected together and to a respective one of said output leads;
the bases of one transistor of each of said pairs of transistors being connected together and to a terminal receiving said bit output of said other comparator;
the bases of the other transistors of said pairs of transistors being connected together and to a reference voltage; and
means connected to the collectors of said two pairs of transistors for producing said digital bit output for one of said comparators.

* * * * *